United States Patent
Chen et al.

(10) Patent No.: US 12,243,968 B2
(45) Date of Patent: Mar. 4, 2025

(54) WAVELENGTH CONVERSION DEVICE

(71) Applicant: Coretronic Corporation, Hsin-Chu (TW)

(72) Inventors: I-Hua Chen, Hsin-Chu (TW); Chi-Tang Hsieh, Hsin-Chu (TW)

(73) Assignee: CORETRONIC CORPORATION, Hsin-Chu (TW)

( * ) Notice: Subject to any disclaimer, the term of this patent is extended or adjusted under 35 U.S.C. 154(b) by 37 days.

(21) Appl. No.: 17/504,870

(22) Filed: Oct. 19, 2021

(65) Prior Publication Data

US 2022/0131053 A1 Apr. 28, 2022

(30) Foreign Application Priority Data

Oct. 27, 2020 (CN) .......................... 202011164093.3

(51) Int. Cl.
| | | |
|---|---|---|
| *G02B 26/00* | (2006.01) | |
| *H01L 33/50* | (2010.01) | |
| *G02B 7/00* | (2021.01) | |
| *G02B 26/02* | (2006.01) | |

(52) U.S. Cl.
CPC .......... *H01L 33/505* (2013.01); *G02B 26/008* (2013.01); *H01L 33/502* (2013.01); *H01L 33/507* (2013.01); *G02B 7/006* (2013.01); *G02B 26/023* (2013.01)

(58) Field of Classification Search
CPC .... G02B 26/008; G02B 7/006; G02B 26/023; H01L 33/505; H01L 33/507; H01L 33/502
USPC ............................ 348/743; 356/418; 359/891
See application file for complete search history.

(56) References Cited

U.S. PATENT DOCUMENTS

| | | | |
|---|---|---|---|
| 2002/0105729 A1* | 8/2002 | Richards | H04N 9/3114 348/E9.027 |
| 2013/0230908 A1 | 9/2013 | Shoji et al. | |
| 2015/0109584 A1* | 4/2015 | Murai | H04N 9/3161 353/31 |
| 2016/0274353 A1* | 9/2016 | Ando | C03C 17/007 |

(Continued)

FOREIGN PATENT DOCUMENTS

| | | |
|---|---|---|
| CN | 101164003 A | 4/2008 |
| CN | 101855581 A | 10/2010 |

(Continued)

OTHER PUBLICATIONS

JP 2018-105941 A Eng Machine Translation (Year: 2018).*
Office Action of CN Application No. 202011164093.3, dated Nov. 2, 2022, 10 pages.

*Primary Examiner* — David Chen
(74) *Attorney, Agent, or Firm* — MUNCY, GEISSLER, OLDS & LOWE, P.C.

(57) ABSTRACT

A wavelength conversion device includes a base plate, at least one wavelength conversion material layer and a balance ring. The base plate has a geometric center, the wavelength conversion material layer is disposed on the base plate, and the balance ring is disposed on the base plate and rotates about a rotation shaft. The balance ring has a balancing part, and the balancing part includes at least one of the following structures: (1) a protrusion formed by a part of an outer periphery of the balance ring protruding in a direction away from the rotation shaft; (2) a recess formed by a part of the outer periphery of the balance ring caving in a direction towards the rotation shaft.

15 Claims, 7 Drawing Sheets

(56) References Cited

U.S. PATENT DOCUMENTS

2016/0291315 A1* 10/2016 Hsu .................. G03B 21/204
2020/0310236 A1* 10/2020 Hsu .................. G03B 33/08

FOREIGN PATENT DOCUMENTS

| | | |
|---|---|---|
| CN | 202762072 U | 3/2013 |
| CN | 202785550 U | 3/2013 |
| CN | 203142278 U | 8/2013 |
| CN | 204253437 U | 4/2015 |
| CN | 107965556 A | 4/2018 |
| CN | 207922119 U | 9/2018 |
| CN | 109212876 A | 1/2019 |
| CN | 208927508 U | 6/2019 |
| CN | 209266203 U | 8/2019 |
| CN | 110685875 A | 1/2020 |
| CN | 211474501 U | 9/2020 |
| CN | 111752079 A | 10/2020 |
| JP | H11248586 A | 9/1999 |
| JP | 2018105941 A * | 7/2018 |
| TW | 200919073 A | 5/2009 |
| TW | 201624103 A | 7/2016 |
| TW | 201702689 A | 1/2017 |
| TW | 201732411 A | 9/2017 |

\* cited by examiner

| thickness:0.13mm density:0.0027 g/mm^3 | balance ring | wavelength conversion device |
|---|---|---|
| conventional design dynamic unbalance weight: 249mg | | |
| Example A dynamic unbalance weight: 25mg | | |
| Example B dynamic unbalance weight: 92mg | | |
| Example C dynamic unbalance weight: 110mg | | |

FIG. 5

| thickness:0.2mm density:0.003g/mm^3 | balance ring | wavelength conversion device |
|---|---|---|
| conventional design dynamic unbalance weight: 361mg | | |
| Example D dynamic unbalance weight: 47mg | | |
| Example E dynamic unbalance weight: 55mg | | |

FIG. 6

WAVELENGTH CONVERSION DEVICE

CROSS-REFERENCE TO RELATED APPLICATION

This application claims the priority benefit of China application serial no. 202011164093.3, filed Oct. 27, 2020. The entirety of the above-mentioned patent application is hereby incorporated by reference herein and made a part of this specification.

BACKGROUND

Field of the Invention

The invention relates to a wavelength conversion device.

Description of the Related Art

Nowadays, a typical method for reducing the unbalance amount of a phosphor wheel is to add or remove weight of mass at a balance ring. Commonly, a single phosphor wheel is often applied with phosphors with different colors/densities that are distributed differently on the phosphor wheel to meet requirements of different types of projectors. This, however, may cause a phosphor wheel to have a considerable amount of unbalance and thus needs more processing time and number of correction times needed in dynamic balancing processes. Additionally, as the temperature of a phosphor wheel increases, the adhesion between a balance ring and a balancing mass adhered to the balance ring may deteriorate due to high temperatures to therefore loosen the balancing mass or cause the balancing mass to fall off the balance ring. This considerably increases the amount of unbalance to increase the risk of damaging a phosphor wheel, enhance vibrations of the phosphor wheel, and thus dramatically increase audible noises.

The information disclosed in this "BACKGROUND OF THE INVENTION" Section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

BRIEF SUMMARY OF THE INVENTION

The invention is directed to a wavelength conversion device having a predefined balance ring to compensate for the structural imbalance and thus reduce the weight of a balancing mass, prevent the balancing mass from falling off the balance ring, and decrease the amount of adhesive needed to fix the balancing mass.

Other features and advantages of the invention can be further understood by the technical features disclosed in the invention.

To achieve one, part, or all of the objectives aforementioned or other objectives, a wavelength conversion device provided by an embodiment of the invention includes a base plate, at least one wavelength conversion material layer and a balance ring. The base plate has a geometric center, the wavelength conversion material layer is disposed on the base plate, and the balance ring is disposed on the base plate and rotates about a rotation shaft. The balance ring has a balancing part, and the balancing part includes at least one of the following structures: (1) a protrusion formed by a part of an outer periphery of the balance ring protruding in a direction away from the rotation shaft; (2) a recess formed by a part of the outer periphery of the balance ring caving in a direction towards the rotation shaft.

Base on the above, the embodiments of the invention achieve at least one of the following advantages or effects. Because the balance ring has at least one of a protrusion and/or a recess to allow for different distance values between the outer periphery of the balance ring and the geometrical center of the base plate, the predefined shape of the balance ring is allowed to compensate for the structural imbalance of the wavelength conversion device to reduce the processing time and number of correction times needed in dynamic balancing processes, reduce the weight of a balancing mass to thus prevent the balancing mass from falling off the balance ring, and decrease the amount of adhesive needed to fix the balancing mass. Further, because the balancing mass may be positioned above an air gap between the base plate and the balance ring to lengthen a heat conduction path between the base plate and the balancing mass, the amount of heat transferred from the base plate to the balancing mass via the adhesive can be reduced.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
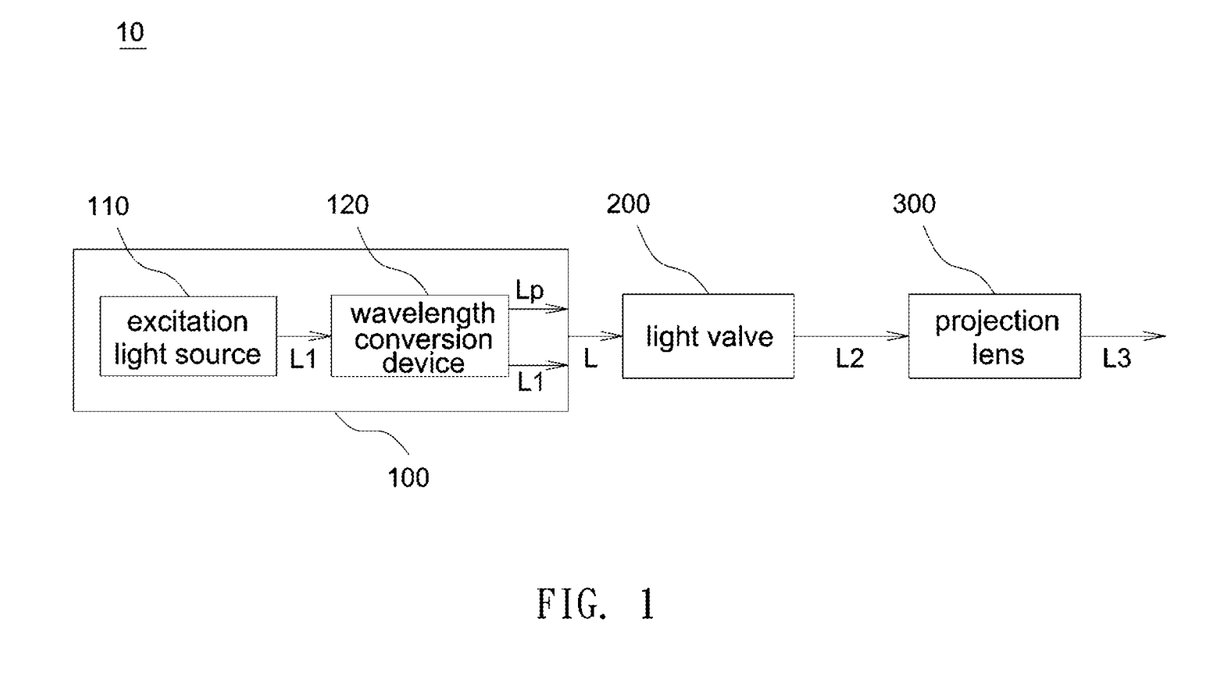
FIG. 1 shows a schematic block diagram of a projector having a wavelength conversion device in accordance with an embodiment of the invention.

FIG. 1 shows a schematic diagram of a projector having a wavelength conversion device in accordance with an embodiment of the invention. As shown in FIG. 1, a projector 10 may include an illumination system 100, a light valve 200 and a projection lens 300. The illumination system 100 is configured to provide an illumination beam L, and the illumination system 100 may include an excitation light source 110 and a wavelength conversion device 120. The excitation light source 110 is configured to provide an excitation beam L1, the wavelength conversion device 120 is disposed on a transmission path of the excitation beam L1 and includes a wavelength conversion region and a non-conversion region. The wavelength conversion region is configured to convert the excitation beam L1 into a conversion beam Lp having a wavelength different to the wavelength of the excitation beam L1, and the non-conversion region is configured to reflect or transmit the excitation beam L1 without conversion. The illumination system 100 may include additional optical components to relay the illumination beam L to the light valve 200. The light valve 200 is disposed on a transmission path of the illumination beam L that includes the excitation beam L1 and the conversion beam Lp to modulate the illumination beam L into an image beam L2. The projection lens 300 is disposed on a transmission path of the image beam L2 to convert the image beam L2 into a projection beam L3.

In this embodiment, the excitation light source 110 may be a laser diode or a laser diode bank, and the wavelength conversion device 120 may be a phosphor wheel, but the invention is not limited thereto. The light valve 200 may be a reflective optical modulator or a transmissive optical modulator, the reflective optical modulator may be a liquid crystal on silicon panel or a digital micro-mirror device, and the transmissive optical modulator may be a transparent liquid crystal panel, an electro-optical modulator, a maganeto-optic modulator or an acousto-optic modulator. It should be noted that the light valve 200 used in the embodiments of the invention is not limited to a specific configuration or a specific type.

Figure 2A:
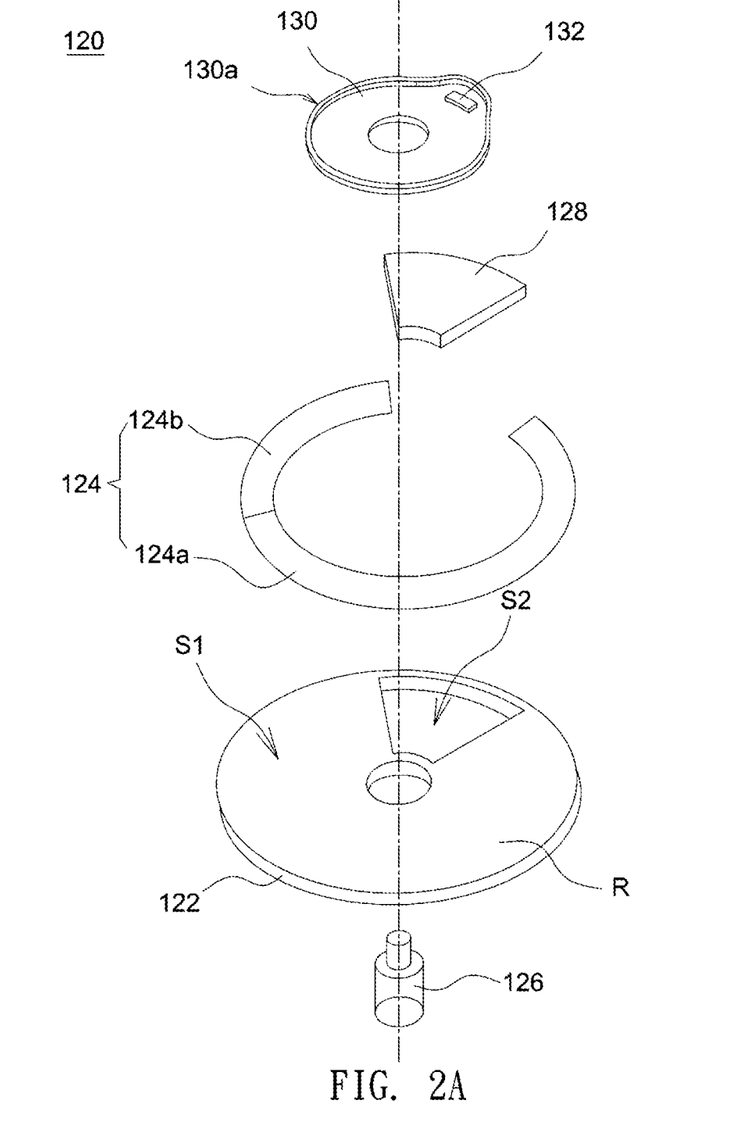
FIG. 2A is an exemplary exploded diagram of a wavelength conversion device in accordance with an embodiment of the invention.
Figure 2B:
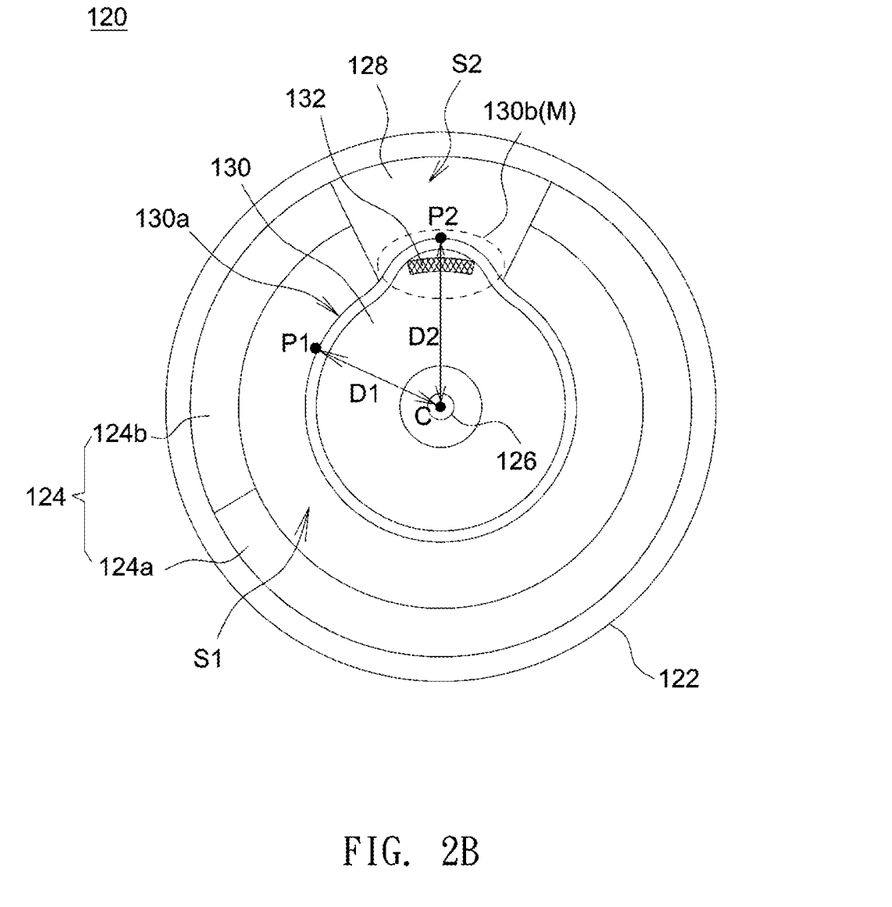
FIG. 2B shows a schematic plan view of the wavelength conversion device shown in FIG. 2A.

FIG. 2A is an exemplary exploded diagram of a wavelength conversion device in accordance with an embodiment of the invention, and FIG. 2B shows a schematic plan view of the wavelength conversion device shown in FIG. 2A. As shown in FIG. 2A, the wavelength conversion device 120 includes a base plate 122, at least one wavelength conversion material layer 124, a balance ring 130 and a rotation shaft 126. It should be noted that, though FIG. 2A and FIG. 2B exemplify the first wavelength conversion material layer 124a and the second wavelength conversion material layer 124b, the number of wavelength conversion material layers 124 set out in all embodiments of the invention is not limited to two.

The wavelength conversion device 120 may further include a balancing mass 132 disposed on the balance ring 130. In this embodiment, the balancing mass 132 is disposed between an outer periphery 130a and a geometric center of the balance ring 130 to allow the wavelength conversion device 120 to rotate in a balance state (i.e. balanced dynamically), and the balancing mass 132 may abut against an inner wall of the outer periphery 130a to obtain a supporting force acting in a radial direction of the balance ring 130. At least one wavelength conversion material layer 124 and the balance ring 130 are disposed on the base plate 122, and, in one embodiment, a geometric center C of the base plate 122 and a center of rotation of the balance ring 130 coincide with the rotation shaft 126. The rotation shaft 126 is coupled to a motor (not shown) and driven by the motor to rotate. The balancing mass 132 may cooperate with the balance ring 130 to adjust the overall weight distribution and thus reduce the structural imbalance of the wavelength conversion device 120. The balancing mass 132 may be a metal sheet or a photo-curing adhesive (such as epoxy resin) that can be attached to the balance ring 130. The wavelength conversion material layer 124 and the balance ring 130 are disposed on the base plate 122, and the wavelength conversion material layer 124, the balance ring 130 and the base plate 122 rotate about the rotation shaft 126.

In one embodiment, the wavelength conversion material layer 124 may be formed from phosphor glass, phosphor ceramic, polycrystalline phosphor, single-crystal phosphor or fluorescent silicone. The first wavelength conversion material layer 124a and the second wavelength conversion material layer 124b may be formed from phosphors having mutually different materials/densities. Besides, the base plate 122 and the wavelength conversion material layer 124 disposed on the base plate 122 may rotate about the rotation shaft 126.

The base plate 122 may be a metal base plate and may have a reflective surface R. In this embodiment, the base plate 122 has a first region S1 and a second region S2, the first region S1 and the second region S2 adjoin each other and are arranged surrounding the rotation shaft 126. The first region S1 is provided with the wavelength conversion material layer 124 to form a wavelength conversion region, and the second region S2 is not provided with the wavelength conversion material layer 124 to thus form a non-conversion region. The wavelength conversion device 120 may further include a transparent plate 128 disposed in the second region S2 of the base plate 122. The transparent plate 128 may be a coated glass plate or a glass plate with a reflective layer to transmit or reflect the excitation beam L1. In other embodiment, the surface R of the base plate 122 in the second region S2 may be a reflective surface.

The first region S1 and the second region S2 of the base plate 122 alternately run into the transmission path of the excitation beam L1 shown in FIG. 1. In one embodiment, the excitation beam L1 may be a blue light beam, the first wavelength conversion material layer 124a may convert the excitation beam L1 into a yellow light beam, the second wavelength conversion material layer 124b may convert the excitation beam L1 into a green light beam, and the excitation beam L1 may directly pass through the base plate 122 via the second region S2. In other embodiment, the excitation beam L1 may be reflected by the second region S2 of the base plate 122.

Referring to FIG. 1, in this embodiment, the conversion beam Lp include the yellow and green light beams, and the excitation beam L1 is the blue light beam. In the first region S1, the conversion beam Lp is reflected by the reflective surface R of the base plate 122, and, in the second region S2, the excitation beam L1 passes through the base plate 122. The conversion beam Lp and the excitation beam L1 are transmitted to other optical components of the illumination system 100 and gathered together to form the illumination beam L shown in FIG. 1.

As shown in FIG. 2B, the balance ring 130 is disposed on the base plate 122 and covers part of the first region S1 and part of the second region S2. The balance ring 130 has an outer periphery 130a at the outermost position and a balancing part 130b. In this embodiment, the outer periphery 130a is slightly higher than inner areas of the balance ring 130 and thus defines a height, the balancing part 130b is a protrusion M protruding in a direction (such as a radial direction) away from the rotation shaft 126 to result in different distances of the outer periphery 130a relative to a geometrical center C of the base plate 122 (center of rotation of the balance ring 130), thus forming a radial asymmetrical shape. In this embodiment, the base plate 122 is in the shape of a circle and thus the geometric center C of the base plate 122 is the center of circle that coincides with the rotation shaft 126.

In this embodiment, the balancing part 130b (protrusion M) of the balance ring 130 is disposed in the second region S2 of the base plate 122, a first distance D1 is defined as the shortest distance between the outer periphery 130a of the balance ring 130 in the first region S1 and the geometric center C of the base plate 122 (such as the distance between a first point P1 and the geometric center C), a second distance D2 is defined as the largest distance between the outer periphery 130a of the balance ring 130 in the second region S2 and the geometric center C of the base plate 122 (such as the distance between a second point P2 and the geometric center C), and the first distance D1 is different to the second distance D2. In this embodiment, the first distance D1 is smaller than the second distance D2.

According to the above embodiments, because the balance ring 130 is designed to allow for different distance values between the outer periphery 130a (outer walls) of the balance ring 130 and the geometrical center C of the base plate 122, this opens up the possibility to use a predefined shape of the balance ring 130 to compensate for the structural imbalance of the wavelength conversion device 120. For example, as shown in FIG. 2B, because the second region S2 of the base plate 122 is not provided with the wavelength conversion material layer 124 to have slighter weight as compared to the first region S1 of the base plate 122, the center of gravity of the wavelength conversion device 120 deviates from the second region S2 for a distance. Therefore, when the protrusion M is disposed in the second region S2 to increase the weight distributed over the second region S2, the deviation of the center of gravity is corrected to reduce the structural imbalance of the wavelength conversion device 120, and it follows that the processing time needed in dynamic balancing processes and the weight of the balancing mass 132 are both decreased. The reduced weight of the balancing mass 132 may advantageously prevent the balancing mass 132 from falling off the balance ring 130 and decrease the amount of adhesive needed to fix the balancing mass 132.

Figure 3:
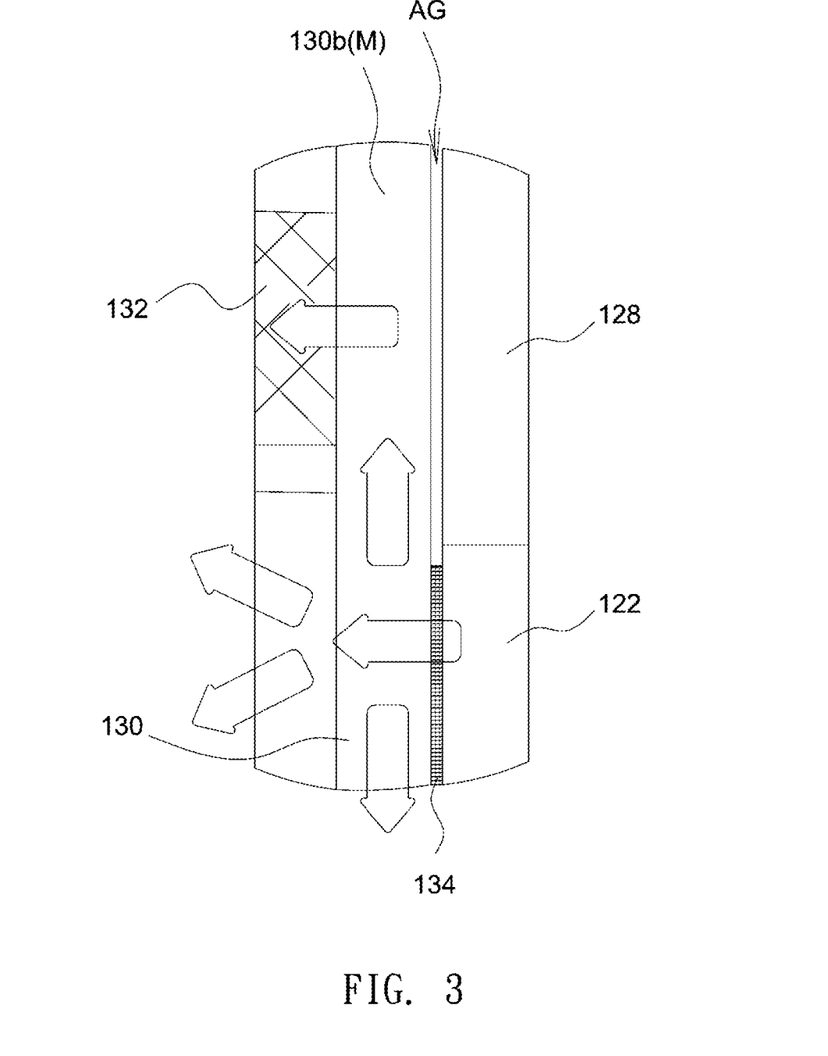
FIG. 3 shows a schematic cross-section illustrating positional relationships of the balancing mass and the balance ring shown in FIG. 2 relative to surrounding components.

FIG. 3 shows a schematic cross-section illustrating positional relationships of the balancing mass and the balance ring shown in FIG. 2 relative to surrounding components. As shown in FIG. 3, a part of the balance ring 130 is adhered to the base plate 122 via an adhesive 134 (such as a structure adhesive). Therefore, the space between the base plate 122 and the balance ring 130 is divided into a sub space full of the adhesive 134 and an air gap AG without the adhesive 134. In this embodiment, the balancing part 130b (such as the protrusion M) of the balance ring 130 is disposed in the second region S2, an air gap AG is provided between the balancing part 130b (such as the protrusion M) and the base plate 122, and thus the balancing mass 132 disposed on the balancing part 130b (such as the protrusion M) is positioned above the air gap AG.

As can be seen from the heat transfer direction indicated by arrows shown in FIG. 3, because the balancing mass 132 is positioned above the air gap AG to lengthen a heat conduction path between the base plate 122 and the balancing mass 132, the amount of heat transferred from the base plate 122 to the balancing mass 132 via the adhesive 134 can be reduced. By way of example, the balancing mass 132 may be a weight-compensation metal sheet attached to the balance ring 130 via an adhesive. Once the heat transferred to the balancing mass 132 is reduced, the service life of the adhesive 134 between the balancing mass 132 and the balance ring 130 is increased to reduce the risk that the metal sheet and the adhesive 134 fall off the balance ring 130 due to malfunctions of the adhesive 134. Besides, the second region S2 may be filled with glass materials having low heat transfer coefficients to further reduce the heat transferred to the balancing mass 132 through, for example, radiation.

Figure 4:
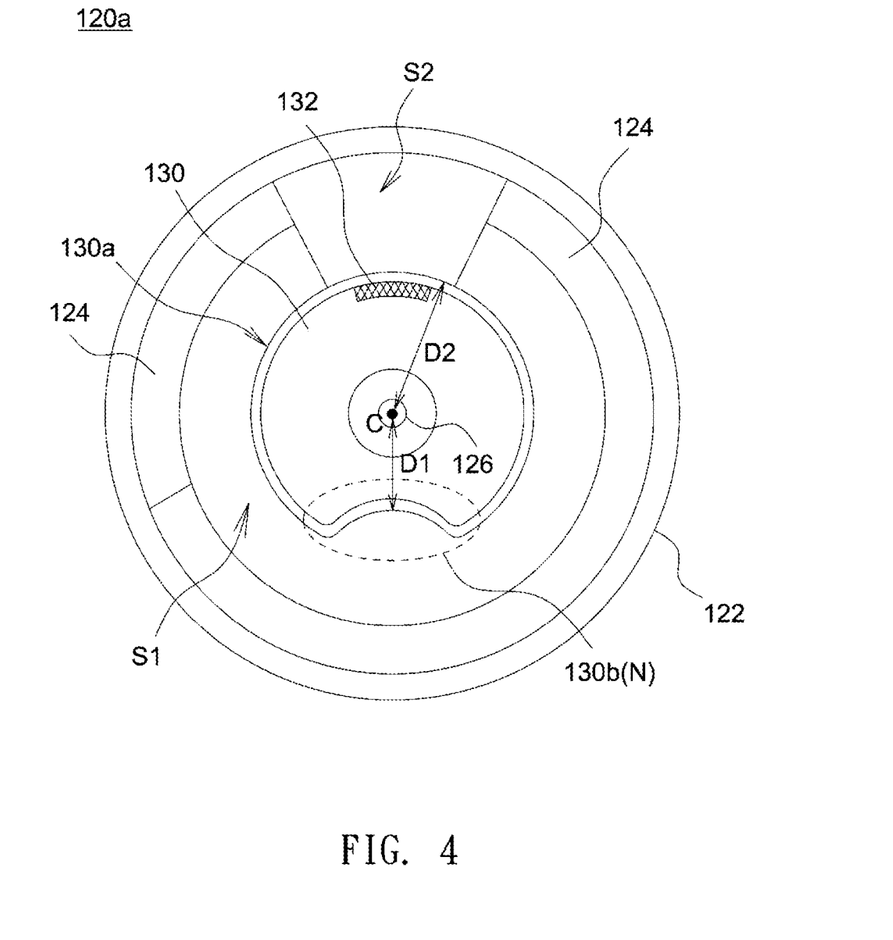
FIG. 4 shows a schematic plan view of a wavelength conversion device in accordance with another embodiment of the invention.

FIG. 4 shows a schematic plan view of a wavelength conversion device in accordance with another embodiment of the invention. As shown in FIG. 4, in this embodiment, because the second region S2 of the base plate 122 is not provided with a wavelength conversion material layer 124 to have slighter weight as compared to the first region S1 of the base plate 122, the center of gravity of the wavelength conversion device 120 may deviate away from the second region S2 for a distance. Therefore, a recess N caving in a direction towards the rotation shaft 126 is formed in a lower part of the first region S1 of the base plate 122 to serve as a balancing part 130b of the balance ring 130. In this embodiment, the recess N is disposed opposite the second region S2, and the recess N and the second region S2 are located on two opposite sides of the rotation shaft 126 to allow for reducing the structural imbalance of the wavelength conversion device 120a. In this embodiment, the balancing part 130b of the balance ring 130 is disposed in the first region S1, a first distance D1 is defined as the shortest distance between the outer periphery 130a of the balance ring 130 in the first region S1 and the geometric center C of the base plate 122, a second distance D2 is defined as the largest distance between the outer periphery 130a of the balance ring 130 in the second region S2 and the geometric center C of the base plate 122, and the first distance D1 is different to the second distance D2. In this embodiment, the first distance DI is smaller than the second distance D2.

The balancing part 130b is not limited to a specific shape or structure, as long as it may change the profile of the balance ring 130 to reduce the amount of unbalance. For example, the balancing part 130b may be a protrusion M, a recess N, or a structure having both the protrusion M and the recess N. Further, the radius of curvature of each of the protrusion M and the recess N is different to the radius of curvature of the balance ring 130, where a center of curvature of the balance ring 130 is the geometric center C. Alternatively, the center of curvature of each of the protrusion M and the recess N does not coincide with the geometric center C. Typically, different wavelength conversion material layers may use their respective phosphors with different densities/materials to meet requirements of different types of projectors. In that case, different wavelength conversion material layers have their respective phosphor distributions to result in different weight distributions at different areas. Therefore, the shape and number of the balancing part may vary without limitation to reduce the amount of unbalance of a wavelength conversion device. For example, the balance ring may form a protrusion in a radial position of the base plate 122 given less weight (such as the second region S2 of the base plate 122), or the balance ring may form a recess in a radial position of the base plate 122 given much weight (such as the first region S1 of the base plate 122). Moreover, in the above embodiments, the balancing mass 132 is positioned collinear with the rotation shaft 126 and the balancing part 130b, but the invention is not limited thereto. The balancing mass 132 may be disposed in other position if desired. In other embodiment, the balance ring 130 may have multiple protrusions or recesses to achieve optimized dynamic balancing.

Figure 5:
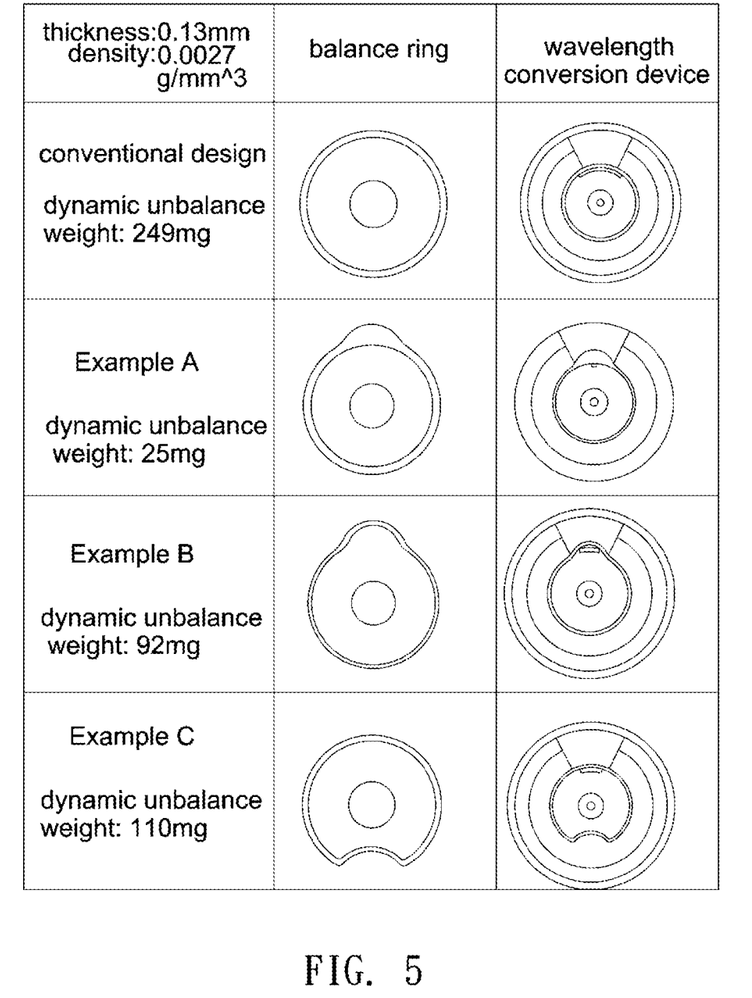
FIG. 5 shows a comparison diagram comparing a conventional wavelength conversion device with various embodiments of the invention for the effects of dynamic unbalance compensation.

FIG. 5 shows a comparison diagram comparing a conventional wavelength conversion device with various embodiments of the invention for the effects of dynamic unbalance compensation. The sample wavelength conversion material layer shown in FIG. 5 for the dynamic balancing test has a thickness of 0.13 mm and a phosphor density of 0.0027 g/mm^3. The balance ring of the convention design has a circular profile, the balance rings of Example A and Example B each have a protrusion to form a radial asymmetrical profile, and the balance ring of Example C has a recess to form a radial asymmetrical profile. Example A is different to Example B in the thickness of the outer periphery, where the thickness is defined as a distance between an inner wall and an outer wall of the outer periphery. Herein, the outer periphery of Example B has a constant thickness at different areas, and the outer periphery of Example A has different thicknesses at different areas and reaches a maximum thickness at the protrusion of the balance ring. The inner wall of the outer periphery of Example A maintains a constant distance at different areas with respect to the geometric center of the base plate, under the condition that the first distance D1 is smaller than the second distance D2 as shown in FIG. 2B. Besides, with regard to Example B, the balancing mass is positioned collinear with the balancing part (protrusion) and the rotation shaft, and the balancing mass is located between an outer periphery of the balancing part (protrusion) and the rotation shaft. In comparison, with regard to Example C, the balancing mass is positioned collinear with the balancing part (recess) and the rotation shaft, and the rotation shaft is located between the outer periphery of the balancing part (recess) and the balancing mass.

As can be clearly seen from FIG. 5, the conventional wavelength conversion device has a dynamic unbalance weight of 249 mg; in contrast, the wavelength conversion devices of Example A, Example B and Example C have dynamic unbalance weights of 25 mg, 92 mg and 110 mg, respectively. Therefore, in order to optimize the dynamic balancing of the wavelength conversion device, a balancing mass with substantially the same weight should be provided to compensate the dynamic unbalance weight.

Figure 6:
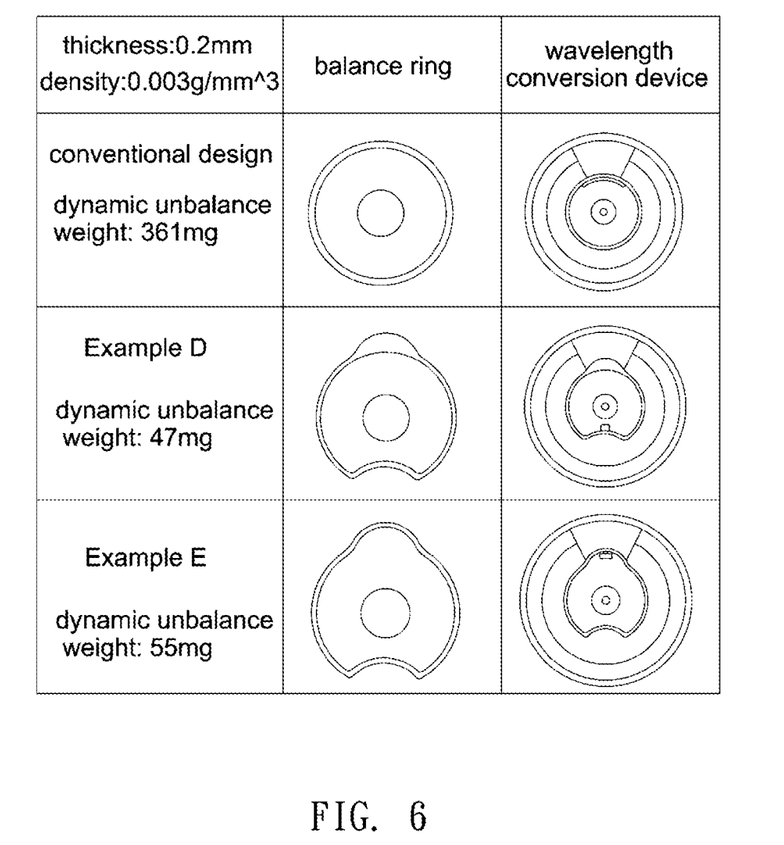
FIG. 6 shows another comparison diagram comparing a conventional wavelength conversion device with various embodiments of the invention for the effects of dynamic unbalance compensation.

FIG. 6 shows another comparison diagram comparing a conventional wavelength conversion device with various embodiments of the invention for the effects of dynamic unbalance compensation. The sample wavelength conversion material layer shown in FIG. 6 for the dynamic balancing test has a thickness of 0.2 mm and a phosphor density of 0.003 g/mm^3. The balance ring of each of Example D and Example E has both a protrusion and a recess, the balance ring of Example D is formed by a combination of two separate pieces, and the balance ring of Example E is integrally formed as a one-piece construction. The balancing mass of Example D is disposed away from the second region S2, and the balancing mass of Example E is disposed near the second region S2.

As can be clearly seen from FIG. 6, the conventional wavelength conversion device has a dynamic unbalance weight of 361 mg; in contrast, the wavelength conversion devices of Example D and Example E have dynamic unbalance weights of 47 mg and 55 mg, respectively. In order to optimize the dynamic balancing of the wavelength conversion device, a balancing mass with substantially the same weight should be provided to compensate the dynamic unbalance weight. The dynamic unbalance weight indicates the weight of a balancing mass needed to realize dynamic balancing. Therefore, a smaller magnitude of dynamic unbalance weight indicates the predefined shape of a balance ring may achieve better compensation effect to reduce structural imbalance, and a smaller magnitude of dynamic unbalance weight also indicates a lighter balancing mass can be used for the compensation and therefore reduces fabrication costs. As shown in FIG. 5 and FIG. 6, each of Examples A-E may have a reduced dynamic unbalance weight under different phosphor densities, phosphor thickness, fabrication methods and profile shapes. Therefore, the wavelength conversion device according to the above embodiments may achieve a high level of dynamic balancing.

Base on the above, the embodiments of the invention achieve at least one of the following advantages or effects. Because the balance ring has at least one of a protrusion and a recess to allow for different distance values between the outer periphery of the balance ring and the geometrical center of the base plate, the predefined shape of the balance ring is allowed to compensate for the structural imbalance of the wavelength conversion device to reduce processing time and number of correction times needed in dynamic balancing processes, reduce the weight of a balancing mass to thus prevent the balancing mass from falling off the balance ring, and decrease the amount of adhesive needed to fix the balancing mass.

Further, because the balancing mass may be positioned above an air gap between the base plate and the balance ring to lengthen a heat conduction path between the base plate and the balancing mass, the amount of heat transferred from the base plate to the balancing mass via the adhesive can be reduced.

In addition, a balancing part of the balance ring and a balancing mass on the balancing part may be disposed on a region filled with glass materials and without a wavelength conversion material layer. The comparatively low heat transfer coefficients of glass materials may further reduce the heat (such as radiation heat) transferred to the balancing mass and the adhesive for fixing the balancing mass.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A wavelength conversion device, comprising:
   a base plate having a geometric center;
   at least one wavelength conversion material layer disposed on the base plate;
   a balance ring disposed on the base plate and having a balancing part, wherein the balance ring includes an outer periphery and inner areas enclosed by the outer periphery, and the outer periphery is higher than the inner areas relative to the base plate to form an inner wall;
   a rotation shaft coinciding with the geometric center of the base plate, and the at least one wavelength conversion material layer, the balance ring and the base plate being configured to rotate about the rotation shaft; and
   at least one balancing mass disposed on the inner areas of the balance ring and abutting against the inner wall of the outer periphery of the balance ring,
   wherein the balancing part comprises a recess formed by a part of the outer periphery of the balance ring caving in a radial direction towards the rotation shaft, and the recess is configured to expose a part of the base plate.

2. The wavelength conversion device as claimed in claim 1, wherein the base plate has a first region provided with the at least one wavelength conversion material layer and a second region not provided with the at least one wavelength conversion material layer, and the recess is located in the first region.

3. The wavelength conversion device as claimed in claim 2, wherein a first distance is defined as a shortest distance between the outer periphery of the balance ring in the first region and the geometric center of the base plate, a second distance is defined as a largest distance between the outer periphery of the balance ring in the second region and the geometric center of the base plate, and the first distance is smaller than the second distance.

4. The wavelength conversion device as claimed in claim 1, wherein the at least one balancing mass is located between the outer periphery of the balance ring and the geometric center of the base plate.

5. The wavelength conversion device as claimed in claim 1, wherein the at least one balancing mass is positioned collinear with the balancing part and the rotation shaft, and the rotation shaft is located between the outer periphery of the balancing part and the at least one balancing mass.

6. The wavelength conversion device as claimed in claim 1, wherein a radius of curvature of the recess is different to a radius of curvature of the balance ring.

7. The wavelength conversion device as claimed in claim 1, wherein a center of curvature of the recess does not coincide with the geometric center of the base plate.

8. The wavelength conversion device as claimed in claim 1, wherein the balancing part further comprises a protrusion formed by another part of the outer periphery of the balance ring protruding in the radial direction of the base plate away from the rotation shaft.

9. The wavelength conversion device as claimed in claim 8, wherein the base plate has a first region provided with the at least one wavelength conversion material layer and a second region not provided with the at least one wavelength conversion material layer, and the protrusion is located in the second region.

10. The wavelength conversion device as claimed in claim 9, wherein a first distance is defined as a shortest distance between the outer periphery of the balance ring in the first region and the geometric center of the base plate, a second distance is defined as a largest distance between the outer periphery of the balance ring in the second region and the geometric center of the base plate, and the first distance is smaller than the second distance.

11. The wavelength conversion device as claimed in claim 8, wherein an air gap exists between the protrusion and the base plate, and the at least one balancing mass is disposed on the protrusion.

12. The wavelength conversion device as claimed in claim 8, wherein the at least one balancing mass is positioned collinear with the balancing part and the rotation shaft, and the at least one balancing mass is located between the another part of the outer periphery of the balancing part and the rotation shaft.

13. The wavelength conversion device as claimed in claim 8, wherein the outer periphery has different thicknesses at different areas and reaches a maximum thickness at the protrusion of the balance ring.

14. The wavelength conversion device as claimed in claim 8, wherein a radius of curvature of the protrusion is different to a radius of curvature of the balance ring.

15. The wavelength conversion device as claimed in claim 8, wherein a center of curvature of the protrusion does not coincide with the geometric center of the base plate.

* * * * *